(12) United States Patent
Lindsey et al.

(10) Patent No.: US 6,948,940 B2
(45) Date of Patent: Sep. 27, 2005

(54) HELICAL MICROELECTRONIC CONTACT AND METHOD FOR FABRICATING SAME

(75) Inventors: Scott E. Lindsey, Brentwood, CA (US); Charles A. Miller, Fremont, CA (US); David M. Royster, Livermore, CA (US); Stuart W. Wenzel, San Francisco, CA (US)

(73) Assignee: FormFactor, Inc., Livermore, CA (US)

( * ) Notice: Subject to any disclaimer, the term of this patent is extended or adjusted under 35 U.S.C. 154(b) by 61 days.

(21) Appl. No.: 10/411,175

(22) Filed: Apr. 10, 2003

(65) Prior Publication Data

US 2004/0203262 A1 Oct. 14, 2004

(51) Int. Cl.$^7$ .............................................. H01R 12/00
(52) U.S. Cl. ........................ 439/66; 439/81; 324/754; 174/773
(58) Field of Search .............................. 439/66, 81–83; 324/754; 174/773–774

(56) References Cited

U.S. PATENT DOCUMENTS 6,659,778 B2 * 12/2003 Li ................................. 439/66
6,672,876 B1 * 1/2004 Takekoshi ..................... 439/66

* cited by examiner

Primary Examiner—Truc T. T. Nguyen
(74) Attorney, Agent, or Firm—N. Kenneth Burraston; Fliesler Meyer LLP (57) ABSTRACT

A microelectronic spring contact for making electrical contact between a device and a mating substrate and method of making the same are disclosed. The spring contact has a compliant pad adhered to a substrate of the device and spaced apart from a terminal of the device. The compliant pad has a base adhered to the substrate, and side surfaces extending away from the substrate and tapering to a smaller end area distal from the substrate. A trace extends from the terminal of the device in a coil pattern over the compliant pad to its end area, forming a helix. At least a portion of the compliant pad end area is covered by the trace, and a portion of the trace that is over the compliant pad is supported by the compliant pad. In an alternative embodiment, the pad is removed to leave a freestanding helical contact.

19 Claims, 5 Drawing Sheets

HELICAL MICROELECTRONIC CONTACT AND METHOD FOR FABRICATING SAME

BACKGROUND OF THE INVENTION

1. Field of the Invention

The present invention relates to microelectronic contacts for use with semiconductor devices and the like.

2. Description of Related Art

The demand for ever-smaller and more sophisticated electronic components has driven a need for smaller and more complex integrated circuits (ICs). The ever-smaller ICs and high lead counts, in turn, require more sophisticated electrical connection schemes, both in packaging for permanent or semi-permanent attachment, and for readily demountable applications such as testing and burn-in.

For example, many modern IC packages have smaller footprints, higher lead counts and better electrical and thermal performance than IC packages commonly used only a few years ago. One such compact IC package is the ball grid array (BGA) package. A BGA package is typically a rectangular package with terminals, normally in the form of an array of solder balls, protruding from the bottom of the package. These terminals are designed to be mounted onto a plurality of bonding pads located on the surface of a printed circuit board (PCB) or other suitable substrate. The solder balls of the array are caused to reflow and bond with bonding pads (terminals) on a mating component, such as by passing the component with the mounted BGA package through an ultrasound chamber or like thermal energy source, and then removing the energy source to cool and harden the solder and form a relatively permanent bond. Once melted and re-hardened, the solder ball connections cannot readily be re-used, if at all. Hence, separate, readily demountable contact elements are required to contact the terminal pads of the IC or the solder balls of the BGA package during testing and burn-in.

The advantages of readily demountable contact elements for use in compact packaging and connection schemes have previously been recognized. Readily demountable, flexible and resilient microelectronic spring contacts for mounting directly to substrates such as ICs are described in U.S. Pat. No. 5,917,707 to Khandros et al. Among other things, the '707 patent discloses microelectronic spring contacts that are made using a wire bonding process that involves bonding a very fine wire to a substrate, and subsequent electroplating of the wire to form a resilient element. These microelectronic contacts have provided substantial advantages in applications such as back-end wafer processing, and particularly for use as contact structures for probe cards, where they have replaced fine tungsten wires. These same or similar contact elements may also be used to make electrical connections between semiconductor devices in general, for making both temporary (readily demountable) and more permanent electrical connections in almost every type of electronic device.

Presently, however, the cost of fabricating fine-pitch spring contacts has limited their range of applicability to less cost-sensitive applications. Much of the fabrication cost is associated with manufacturing equipment and process time. Contacts as described in the aforementioned patents are fabricated in a serial process (i.e., one at a time) that cannot be readily converted into a parallel, many-at-a-time process. Thus, new types of contact structures, referred to herein as lithographic type microelectronic spring contacts, have been developed, using lithographic manufacturing processes that are well suited for producing multiple spring structures in parallel, thereby greatly reducing the cost associated with each contact.

Exemplary lithographic type spring contacts, and processes for making them, are described in the commonly owned, co-pending U.S. patent applications Ser. No. 09/032,473 filed Feb. 26, 1998, by Pedersen and Khandros, entitled "LITHOGRAPHICALLY DEFINED MICROELECTRONIC CONTACT STRUCTURES," and Serial No. 60/073,679, filed Feb. 4, 1998; by Pedersen and Khandros, entitled "MICROELECTRONIC CONTACT STRUCTURES." These applications disclose methods for fabricating the spring structures using a series of lithographic steps, thereby building up the height of the spring contact with several layers of plated metal that may be patterned using various lithographic techniques. Microelectronic spring contacts are preferably provided with ample height to compensate for any unevenness in the mounting substrate and to provide space for mounting components, such as capacitors, under the spring contact.

Methods of achieving adequate height in a single lithographic step, i.e., a single resilient layer, and exemplary structures made thereby, are disclosed in the commonly owned, co-pending U.S. patent applications Ser. No. 09/364,788, filed Jul. 30, 1999 by Eldridge and Mathieu, entitled "INTERCONNECT ASSEMBLIES AND METHODS," and Ser. No. 09/710,539, filed Nov. 9, 2000, by Eldridge and Wenzel, entitled "LITHOGRAPHIC SCALE MICROELECTRONIC SPRING STRUCTURES WITH IMPROVED CONTOURS." The foregoing applications disclose spring elements made from a single layer of metal. The metal layer is plated over a patterned three-dimensional layer of sacrificial material, which has been shaped using a micromachining or molding process. The sacrificial layer is then removed, leaving a free-standing spring contact having the contoured shape of the removed layer.

A need therefore exists for an improved microelectronic spring contact, and method of making it, that achieves or improves upon the performance of multi-layer and single-layer spring contacts at a substantially lower cost. The spring contact should be useful in very dense fine-pitch arrays for directly connecting to IC's and like devices, and be capable of making both relatively demountable and relatively permanent (e.g., soldered) connections.

Moreover, it is desirable that the microelectronic spring contact be useful in compact packaging schemes, where low cost, demountability, and resiliency are important. Exemplary applications may include portable electronic components (cellular phones, palm computers, pagers, disk drives, etc.), that require packages smaller than BGA packages. For such applications, solder bumps are sometimes deposited directly onto the surface of an IC itself and used for attachment to the printed circuit board (PCB). This approach is commonly referred to as direct chip attach or flip-chip. The flip-chip approach is subject to various disadvantages. One key disadvantage is the requirement for a polymer underfill beneath a die. The underfill is required to reduce thermal stresses caused by the relatively low thermal expansion of the silicon die relative to the typically much higher expansion of resin-based PCB's. The presence of the underfill often makes it infeasible to rework the component. Consequently, if the IC or its connection to the PCB is defective, the entire PCB usually must be discarded.

Another type of BGA package, the chip-scale ball grid array or a chip scale package (CSP), has been developed to overcome this disadvantage of flip-chips. In a chip scale package, solder ball terminals are typically disposed underneath a semiconductor die in order to reduce package size, and additional packaging elements are present to eliminate the need for underfill. For example, in some CSP's, a soft compliant elastomer layer (or elastomer pad) is disposed between the die and the solder ball terminals. The solder ball terminals may be mounted onto a thin 2-layer flex circuit, or mounted to terminals on the compliant member. The IC is typically connected to terminals on the flex circuit or elastic member using a wire or tab lead, and the entire assembly (except the ball grid array) is encapsulated in a suitable resin.

The elastomeric member is typically a polymer, such as silicone, about 125 $\mu$m to 175 $\mu$m (5–7 mils) thick. The elastomer pad or layer essentially performs the function of and replaces the underfill used in flip-chips, that is, minimizes thermal mismatch stress between the die and the PCB. In other CSP designs, the IC is adhered directly to the surface of a two-layer flex circuit, and connected to terminals on the chip side of the flex circuit using wire leads. Solder balls are mounted on an opposite surface of the flex circuit. This design lacks an elastomer layer for decoupling the die from the PCB and, therefore, may not eliminate the need for underfill.

Current chip-scale package designs have a number of shortcomings. The elastomeric materials tend to absorb moisture, and if excessive moisture is absorbed, rapid outgassing of this moisture at reflow temperatures may cause the formation of voids in the elastomer layer, or bursting of the package. For example, moisture may be released from polymer materials in the elastomer and become trapped within the die attachment adhesive. Voids may then be formed when this trapped moisture expands during board assembly heating operations, typically causing cracking and package failure. Formation of such voids may be particularly problematic during reflow attachment to a PCB.

Another difficulty with chip-scale package designs is the process for integrating the elastomer member, which is typically done by picking and placing elastomer pads onto individual sites, or by screen printing and subsequently curing a fluid polymer. In either case, it may be difficult to meet the tight tolerances and package flatness required for a CSP application. For example, in a typical CSP design, the package flatness (planarity) should be less than about 25 $\mu$m (1 mil) to ensure that all solder balls establish contact with PCB upon reflow. This level of flatness may be difficult to achieve using prior art processes for depositing the elastomeric materials.

Therefore, it is further desirable to provide an improved microelectronic contact element for applications such as CSPs and flip-chips.

SUMMARY OF THE INVENTION

The structure of the spring contacts according to the present invention may be understood by considering an exemplary method by which they may be fabricated. In an initial step of the method, a precisely shaped pit, such as a pyramidal pit, is formed in a sacrificial substrate using any suitable technique, for example, etching or embossing. Typically, a large array of identical pits will be formed at the same time in the sacrificial substrate, arranged in a pattern corresponding to the desired position of the contact tips to be formed on the electronic device. The surface of the pits may then be coated, if necessary, with a thin layer of a suitable release material, such as polytetrafluoroethylene (PTFE). The pits may then filled with a suitable fluid elastomer, or similar compliant material. In the alternative, the pits may be filled with a sacrificial material. The sacrificial substrate may then be mated to the device substrate on which the spring contacts are to be formed, the elastomer or sacrificial material cured (solidified) in place, thereby adhering the elastomer or sacrificial material to the device, and the sacrificial substrate removed. In the alternative, the compliant or sacrificial material may be cured before the sacrificial substrate is mated to the device substrate, and the compliant or sacrificial members adhered to the device process by some other method, such as application of heat or by a suitable adhesive.

As a consequence of the foregoing steps, the device substrate should be populated with at least one compliant or sacrificial pad or protrusion, and typically, a plurality of compliant or sacrificial pads, positioned away from the working terminals of the device substrate. For most applications, the pads are preferably of similar or nearly identical height and shape, having a relatively wide base and a pointed top. Of course, the pads may be different sizes and/or shapes depending on the requirements of the intended application. Suitable shapes may include pyramids, truncated pyramids, stepped pyramids, prisms, cones, quadrangular solids, and similar shapes. The pads may be essentially solid and homogenous, or may include voids, bubbles, layers, and the like. It is not necessary that conductive contact be established between the compliant or sacrificial members and the device substrate. Also, the compliant or sacrificial pads will generally be distributed in a pitch-spreading pattern relative to the terminals on the device substrate.

In an embodiment of the invention, the compliant pads are primarily elastic, meaning that they are configured to spring back to their original positions after an applied load is removed. In alternative embodiments, the compliant pads may be primarily inelastic, meaning that they will not spring back to their original positions after the applied load is removed; or the compliant pads may be configured to exhibit some combination of elastic and inelastic behavior. One of ordinary skill may select different materials and pad geometries to obtain the desired response characteristics under anticipated load conditions. Of course, where sacrificial protrusions are formed, the elastic properties of the sacrificial material are less important, because the protrusion will be removed before the spring contact is completed.

In an embodiment of the invention, the device substrate, including the protrusions, may be coated with a thin metallic seed layer, such as a titanium-tungsten layer, applied by any suitable process such as sputtering. One or more uniform conformal layers of a sacrificial material, such as an electrophoretic resist material, is then applied over the device substrate. The sacrificial layer is then patterned as desired to expose the seed layer in a pattern of traces extending from the terminals of the device substrate to respective tops of the compliant or sacrificial pads. The trace pattern is in a coil configuration over the compliant pads for imparting a helical shape to the resulting contact structures.

A metallic resilient and/or conductive layer is then plated to the desired depth over the partially exposed seed layer. Nickel or nickel alloy material is generally preferred, plated to a depth sufficient to be suitably strong and resilient. In an embodiment, the nickel material is plated to sufficient depth so the resulting trace is stiffer than the compliant pads. Optionally, the resilient layer is coated with a protective and conductive layer, such as a thin layer of gold, after the plating step. After the desired metallic layers are applied, the layer of sacrificial material and the excess seed layer may be removed using processes that leave the compliant protrusions and metal traces on the device substrate. In the alternative, the compliant or sacrificial pads are also removed, leaving only freestanding spring contacts and metal traces.

The resulting structure is then ready to use without further processing, and comprises a helical spring contact connected to a respective terminal of the device substrate by an integral metal trace. In an embodiment of the invention, a helical contact is positioned on each respective one of the compliant pads. In the alternative, the helical contacts are freestanding, being unsupported by a pad. Preferably, a pointed top of each compliant or sacrificial pad has imparted a relatively sharp pointed tip to each spring contact by the highly conformal plating process. Each contact extends both laterally and vertically from the base of each compliant pad to the top of each pad, providing a cantilevered structure that may impart a beneficial wiping action to the motion of the contact tip when the spring contact is deflected.

Where compliant instead of sacrificial pads are used, the support of the compliant material may enable use of a thinner plated layer for the spring contacts than would otherwise be required to provide adequate contact forces. The thinner plated layer, in turn, may save substantial processing time during the plating step. Also, the foregoing method avoids any need for contouring or molding of a sacrificial layer, any need for separate forming steps for providing a sharp contact tip, and any need for a separate step to provide redistribution traces.

In an alternative embodiment for use with compliant pads, the plating step and the related steps of applying the seed layer and applying and patterning the resist layer are omitted. Instead, the desired traces and contact elements are patterned directly onto the device substrate and the elastomer/compliant protrusions by a method such as sputtering or vapor deposition.

A more complete understanding of the helical microelectronic contact and the horizontal spring contact will be afforded to those skilled in the art, as well as a realization of additional advantages and objects thereof, by a consideration of the following detailed description of the preferred embodiment. Reference will be made to the appended sheets of drawings which will first be described briefly.

DETAILED DESCRIPTION OF THE PREFERRED EMBODIMENT

The present invention provides microelectronic spring contacts that overcome limitations of prior art spring contacts. In the detailed description that follows, like element numerals are used to describe like elements appearing in one or more of the figures.

The present invention achieves the benefits of multi-layer and single-layer lithographic spring contacts as disclosed in the patent applications referenced herein, at a potentially lower cost, and provides additional advantages for certain packaging and connecting applications. The spring contacts of the present invention are believed especially suitable for compact packaging applications, such as flip-chip packages and CSP's, where they may replace or augment the use of ball grid arrays as connection elements.

With proper selection of materials, the spring contacts may also be used for testing and burn-in applications. It is therefore within the scope and intent of the invention that spring contacts according to the invention be fabricated directly on the devices of an unsingulated wafer for initial testing and/or burn-in; remain on the devices after testing for burn-in testing before or after packaging, if desired; and then be used as the primary connection element (i.e., with or without solder or conductive adhesive) for final assembly to an electronic component. In the alternative, the spring contacts of the present invention may be used for any selected one or combination of the foregoing applications, used as secondary connection elements (e.g., IC to flex circuit) within a package incorporating other connection elements such as a BGA, used as the contact elements or interposer elements of a test probe, used within a connector such as a Land Grid Array (LGA) socket, or for any other suitable connection application.

Figure 1:
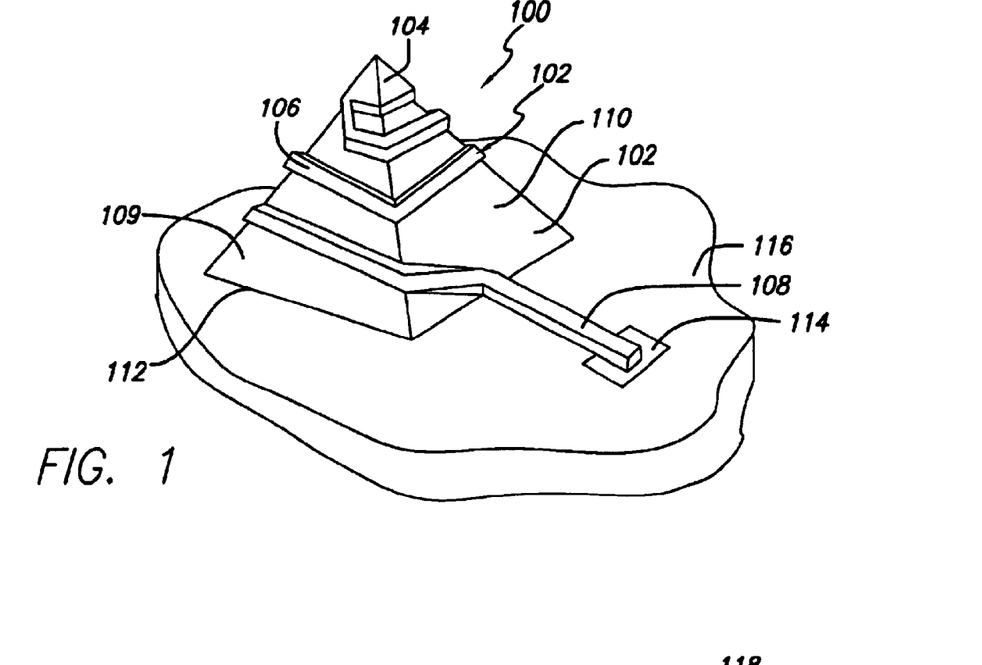
FIG. 1 is an enlarged perspective view of an exemplary microelectronic spring contact according to the invention with a pyramidal compliant pad.

An exemplary helical microelectronic spring contact 100 is shown in FIG. 1. Spring contact 100 comprises two primary layers of material: a first non-conductive elastomer layer in the form of pyramidal compliant pad 110, and a second conductive and resilient layer in the form of metallic trace 102. Spring contact 100 is described as layered because at least a part of a conductive layer (trace 102) overlies a non-conductive layer (pad 110) and the two layers together define the contact 100.

Compliant pad 110 may be any suitable shape within the parameters described herein. In an embodiment of the invention, it is a precisely formed shape, such as a molded shape. In alternative embodiments, pad 110 may be a less well-defined shape, such as a relatively amorphous dollop. The morphology of the pad may be imparted to a relatively rigid metallic tip and beam that are deposited over the pad surface. To ensure a high degree of uniformity across densely populated spring contact arrays, each pad may be formed using a parallel process that minimizes variability between pads. Parallel formation, such as molding en masse, provides the further benefit of requiring less time than individual dollop formation.

Specifically, pad 110 has a pyramidal shape, although other suitable shapes may be used such as, for example, conical, hemispherical, or frusto-conical. In more general terms, the pad 110 may be described as a tapered mass having a relatively large and flat base area 112 where the pad is adhered to a substrate 116, and free side surfaces 109 that extend away from the substrate and taper to a relatively small end area distal from the substrate. The end area is hidden from view in FIG. 1 by the overlaying metallic tip 104. This tapered shape maximizes the area for adhesion to the substrate 116 while efficiently supporting a defined tip structure. In this embodiment, the pyramidal shape reduces the potential for outgassing from the elastomeric material, to ventilate contact 100 from any outgassing that may occur, and to provide increased lateral flexibility for thermal stress relief across contact arrays.

A pyramidal compliant pad may be particularly suitable because pyramid shapes with the desired tapered characteristics may readily be formed with great precision and at extremely small scales by exploiting the properties of commonly available crystalline silicon materials. It is well known that a pyramidal pit, with side surfaces defined by the orientation of crystal planes in the silicon material, may readily be produced by exposing a silicon substrate covered with a suitably patterned layer of photo-resist to a suitable etchant, such as KOH. An array of substantially identical pyramidal pits may thus be produced in a silicon substrate, and the substrate with pits may be used as a mold for forming an array of identical pyramidal compliant pads. Related shapes such as prisms, truncated pyramids or prisms, and stepped pyramids or prisms may be similarly formed using suitable etching and masking process, as should be apparent to one of ordinary skill in the art.

Compliant pad 110 may be made of any suitable material. For example, suitable elastomer materials may include silicone rubber, natural rubber, rubberized plastics, and a wide variety of other organic polymer materials. One of ordinary skill in the art may select a suitable material by considering the intended operating environment (such as temperature or chemical environment) and desired structural characteristics of the spring contact. For example, a suitably soft and resilient material may be selected once the contact geometry, desired range of compressibility, and maximum contact force are defined. Preferably, the pad material is a homogenous plastic material free of any particulate filler material, and is inherently non-conductive. Homogenous plastic material may be more readily formed into a precise pad shape at small scales, such as for compliant pads that are less than about 5 mils (about 130 $\mu$m) wide.

The compliant pad 110 is adhered to substrate 116 at a location spaced apart from terminal 114 for which an electrical connection is desired. A conductive trace 102 is then deposited from the terminal 114 to the end area of the compliant pad, by a process such as electroplating. Trace 102 may be comprised of any suitable metal or metal alloy, and may include one or more layers. For example, trace 102 may be comprised of a relatively thick layer of nickel or nickel alloy for strength and rigidity, covered with a relatively thin layer of gold for conductivity. Trace 102 is preferably an integral piece of metal having a contact tip portion 104 deposited over the end area of pad 110, a pad-supported beam portion 106 running from the base 112 of pad 110 to the contact tip 104, and a substrate-supported redistribution trace portion 108 connecting the beam portion 106 to the terminal 114. Contact tip 104 may be relatively pointed (as shown) for penetrating oxide and contamination layers of a mating terminal. In the alternative, the contact tip 104 may be relatively flat for supporting features such as solder balls. Beam portion 106 may be tapered from a greater width at base 112 to a narrower neck at tip 104, which may provide the advantage of more uniformly distributing stresses along the beam length. In the alternative, beam 106 may be of constant width, or have any other suitable shape. Substrate 116 may be any suitable electronic device, including but not limited to a semiconductor die or wafer, a connector or socket for a die or wafer, and a printed circuit board.

Figure 2:
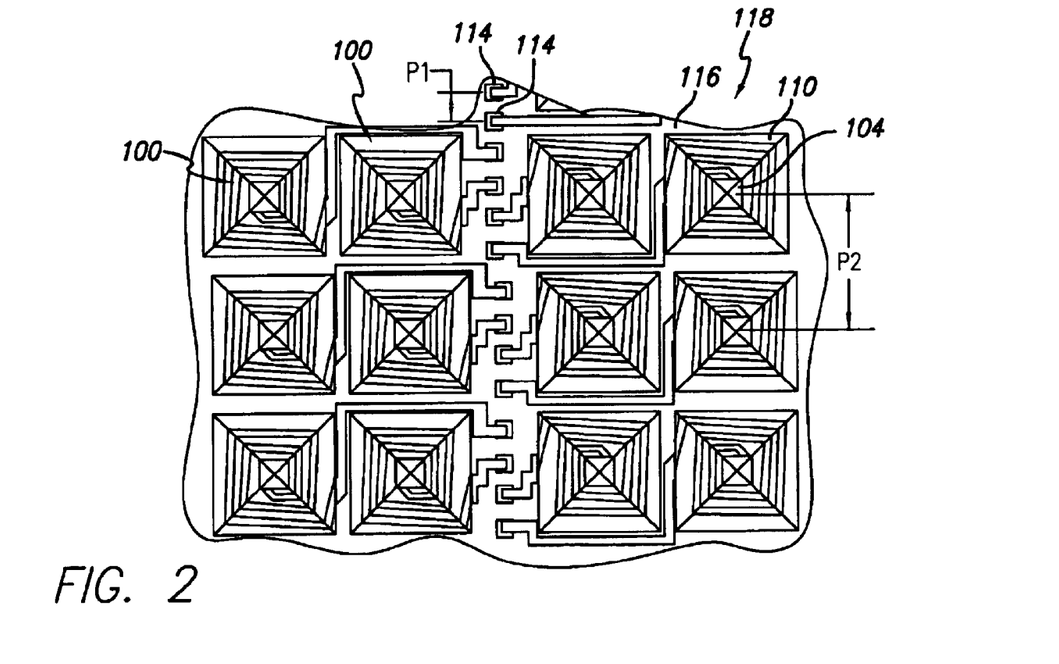
FIG. 2 is an enlarged plan view of an array of microelectronic spring contacts of the type shown in FIG. 1, showing a portion of a pitch-spreading array.

Spring contacts 100 may readily be used in a pitch-spreading array 118, as shown in FIG. 2. Terminals 114 on substrate 116 are disposed at a first pitch P1, and contact tips 104 are disposed at a coarser pitch P2, wherein P2 is greater than P1.

In an embodiment of the invention, a helical trace may be patterned around and up a conical compliant pad to provide a tapered helical spring contact. For example, in FIG. 3, a helical contact 300 is shown, comprising a metallic trace 302 patterned around and up a conical compliant pad 304 disposed on a substrate 306. Contact 300 may additionally include a redistribution trace 308 from a terminal (not shown) of the substrate to the base of the compliant pad. Metallic trace 302 may be relatively stiff compared to compliant pad 304, or relatively flexible, depending on the desired characteristics of contact 300. When the metallic trace is relatively stiff, the helical configuration may provide spring contact 300 with a greater range of deflection without overstressing the material of trace 302.

Figures 3, 4:
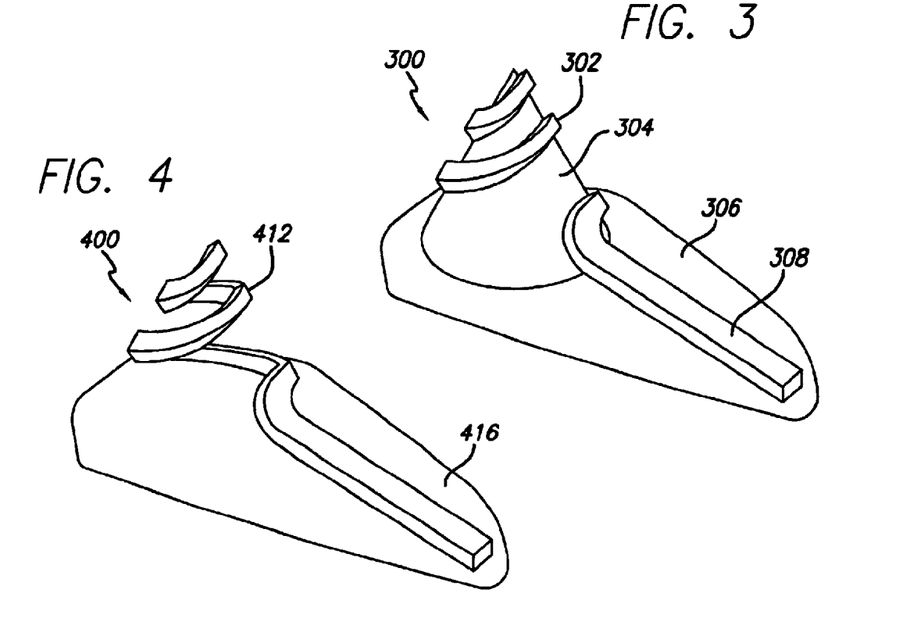
FIG. 3 is an enlarged perspective view of helical spring contact supported by a conical compliant pad.
FIG. 4 is an enlarged perspective view of helical spring contact with the compliant pad removed.

For some applications, it may be advantageous to remove the compliant pad after the metallic trace has been formed, leaving a contact 400 on substrate 416, as shown in FIG. 4. In the alternative, contact 400 may be formed over a suitably shaped pad of non-compliant sacrificial material, and the sacrificial material may then be removed. Like contact 300, spring contact 400 comprises a metallic trace 412 extending away from substrate 416 along a helical path. Optionally, it may be connected via a redistribution trace to a terminal (not shown) of substrate 416. It may be configured as a conical helix (as shown), or in any other desired helical pattern. For example, a quadrangular helical contact could be formed by patterning a metallic trace around and up a pyramidal pad, such as shown in FIG. 1.

Figures 5, 6:
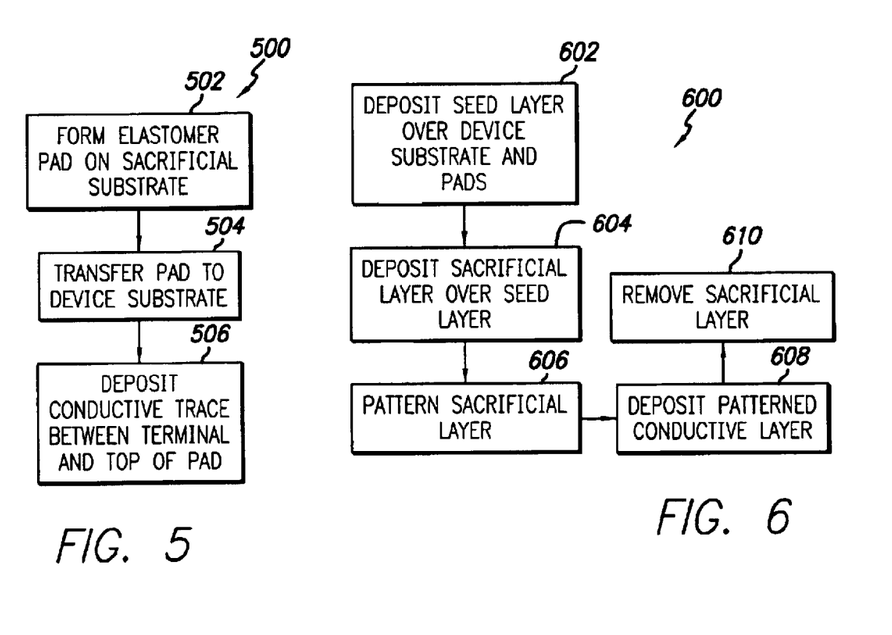
FIG. 5 is a flow diagram of showing exemplary steps of a method for forming a microelectronic spring contact according to the invention.
FIG. 6 is a flow diagram showing exemplary steps of a method for depositing a conductive trace between a terminal and a compliant pad.

FIG. 5 shows exemplary steps of a method 500 for forming a microelectronic spring contact according to the invention. In initial step 502, a compliant pad is formed on a sacrificial substrate. To form an array of compliant pads, precision pits in a sacrificial substrate, such as a silicon substrate, in a pattern corresponding to the desired arrangement of contact tips in the spring contact array that is to be formed. The precision pits are formed in a shape corresponding to the desired shape of compliant pad, for example, a pyramidal pit is used to form a pyramidal pad, and so forth. Any suitable method may be used for forming the precision pits; in particular, various lithographic/etching techniques may be employed to form pits of various shapes. After the pits have been created, the sacrificial substrate is preferably coated with a thin layer of a suitable release agent, such as a PTFE material or other fluoropolymer. An alternative method of forming a compliant pad is by deposition of a dollop of uncured or softened elastomer material directly on a substrate, and then curing or hardening the elastomer in place.

After the sacrificial substrate has been prepared, the pits may be filled with the selected elastomeric material, preferably in a liquid state. The substrate on which the contacts are to be formed (the "device substrate") may then be mounted to the sacrificial substrate, and the elastomeric material cured or hardened with the device substrate in place, thereby adhering the compliant pads to the substrate. The substrate and its attached pads may then be removed from the sacrificial substrate, transferring the pads to the device substrate as indicated at step 504. The sacrificial substrate may be re-used as desired.

In the alternative, after the pits in the sacrificial substrate are filled with the liquid elastomer, the elastomer material may be cured or hardened with the sacrificial substrate left free and open. The sacrificial substrate may then be coated with a suitable adhesive material, thereby coating the exposed bases of the compliant pads. Preferably, the adhesive material is patternable, so that it may be removed from the sacrificial substrate except in regions over the elastomer material. In addition, the adhesive material is preferably pressure-sensitive, so that it will adhere on contact with a mating substrate. The compliant pads may then be transferred to the device substrate as desired.

With the compliant pads in place on the device substrate, at step 506, a conductive trace is deposited between a terminal of the device substrate and the top of a corresponding pad. FIG. 6 shows exemplary steps of a method 600 for depositing a conductive trace on a device substrate and compliant pad. At step 602, a seed layer is deposited over the entire surface of the device substrate and its attached compliant pads. One suitable seed layer is a sputtered titanium-tungsten layer; a suitable seed layer may be selected by one skilled in the art. A seed layer may also be deposited in other ways, including, for example, electroless deposition.

At step 604, a sacrificial layer is deposited over the seed layer. The sacrificial layer is a patternable material, such as a photoresist material, and is preferably applied as a highly conformal layer over the device substrate and its protruding elastomeric pads. Various methods may be used to deposit a conformal layer of resist material. One suitable coating method for thicknesses up to about 35 μm is electrodeposition (electrophoretic resist). Other methods may include spray coating, spin coating, or meniscus coating, in which a laminar flow of coating material is passed over the device substrate. A greater depth may be built up by successively coating and curing layers of material. The minimum depth of the sacrificial layer is preferably equal or greater than the desired thickness of the metallic trace to be deposited.

At step 606, the sacrificial layer is patterned to expose the seed layer in the areas where the conductive traces are to be deposited. Generally, patterning may be accomplished using any suitable photo-patterning technique as known in the art. At step 608, the conductive trace material is deposited to the desired depth over the exposed areas of the seed layer, such as by electroplating. Successive layers of different materials, such as a relatively thick layer of nickel or nickel alloy, followed by a relatively thin layer of gold, may be applied as desired. At step 610, the sacrificial layer is removed, such as by dissolving in a suitable solvent. The device is thereby provided with an array of spring contacts according to the invention.

For spring contacts in which the metal trace is to be relatively thin and flexible, the metal trace need not be deposited by electroplating, and may preferably be deposited by a method such as sputtering or vapor deposition. In such case, the entire surface of the device substrate and compliant pad may be coated with a thin layer or layers of metal to the desired depth, as if with a seed layer. Then, a photoresist layer may be applied and patterned to protect those areas of the device substrate where a metallic trace layer is desired, and the remaining unprotected areas of the metal layer removed in an etching step. By eliminating the electroplating step, processing time may be substantially reduced for those applications that do not require a relatively stiff metallic contact element.

Figure 7A:
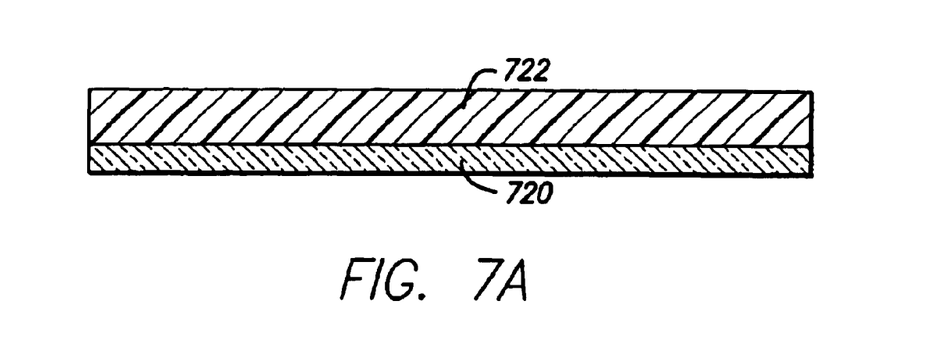
FIGS. 7A–F are enlarged cross-sectional views of a substrate and materials layered thereon during exemplary steps of a method for making a helical spring contact such as shown in FIGS. 3 and 4.
Figure 7B:
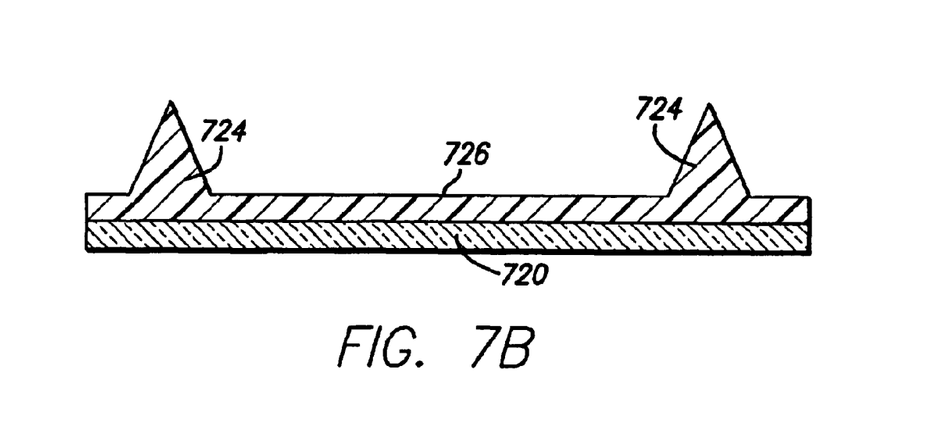

One suitable adaptation of methods 500 and 600 to form a helical spring contact is described with reference to FIGS. 7A–7F. FIG. 7A shows a cross-sectional view of a base substrate 720, such as a semiconductor wafer, ceramic tile, or probe card, covered with a layer 722 of compliant material, which may be a layer of substantially uniform thickness. The compliant material for layer 722 may be any suitable moldable material, such as one of the polymer materials mentioned herein for forming compliant pads, or any moldable sacrificial material, such as a photo-resist material, whether or not it is compliant when cured.

Layer 722 may be molded or formed to provide one or more pads or protrusions 724, such as by pressing an embossing tool into layer 722. An embossing tool may leave a residual layer 726, that may be removed using any suitable process, such as a plasma isotropic etch. In the alternative, pads 724 may be molded using a liquid resin as described above, or may be provided by etching or otherwise removing material in a suitable pattern from layer 722. It should be appreciated that pads 724 are not drawn to any particular scale. In general, the vertical scale of FIGS. 7A–F is exaggerated relative to a typical thickness of substrate 720, to show features that might not otherwise be apparent.

Figure 7C:
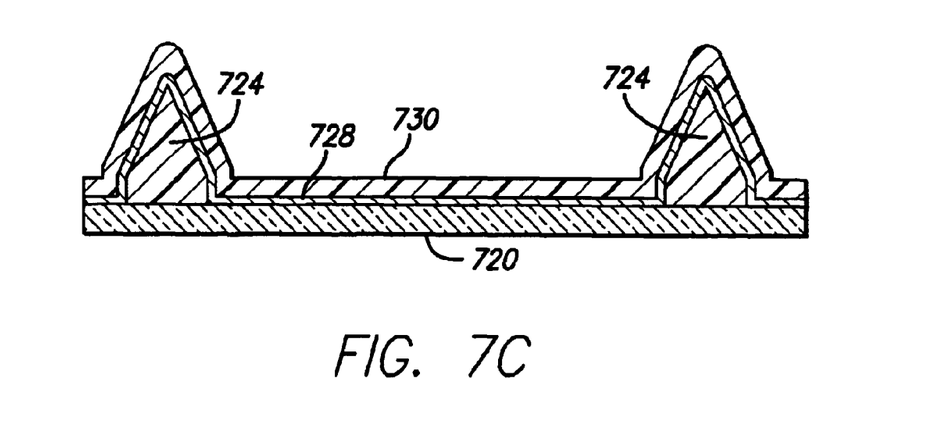
Figure 7D:
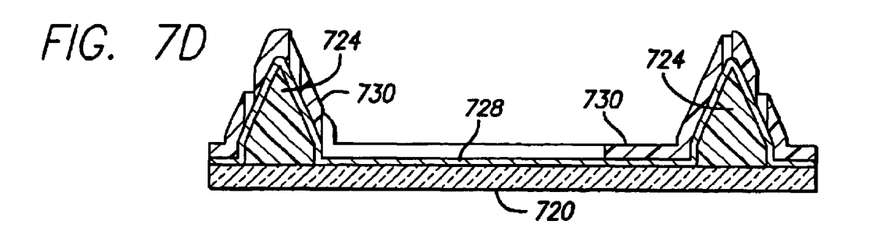
Figure 7E:
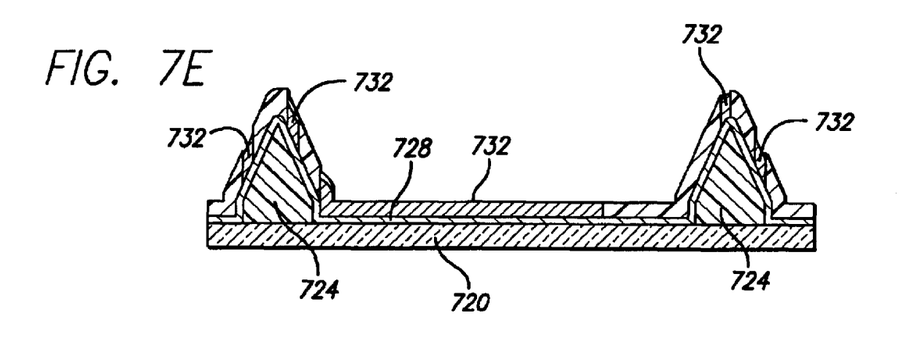

A seed layer 728 may then be deposited over the substrate 720 and pads 724, such as by sputtering. A sacrificial layer 730, such as a layer of photoresist, is then deposited over the seed layer, leaving a structure such as shown in FIG. 7C. Layer 730 is then patterned to reveal the seed layer 728 in areas where it is desired to deposit a thicker layer of a metallic material. A view of layer 730 after patterning is shown in FIG. 7D. A conductive material 732 may then be deposited onto the exposed seed layer 728 using a process such as electroplating. Any suitable conductive material may be used, such as the nickel or nickel alloy materials described above. A view of the sacrificial layer 730 with the conductive material 732 plated over the seed layer is shown in FIG. 7E.

Figure 7F:
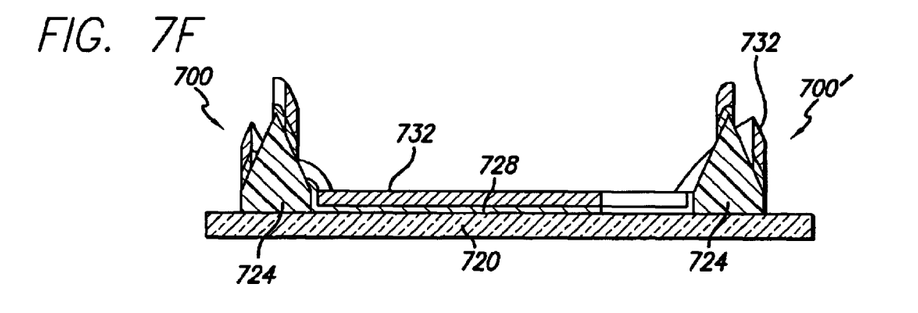
Figure 8:
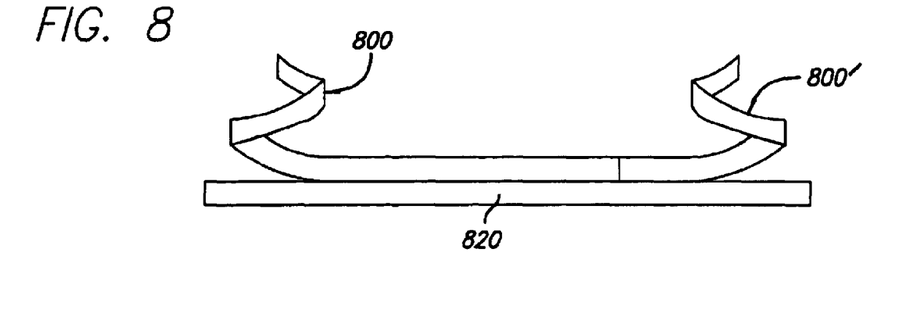
FIG. 8 is an enlarged side view showing helical spring contacts of a type similar to those shown in FIG. 4.

The sacrificial layer 730 may then be removed as known in the art to provide one or more spring contacts 700, 700' as shown in FIG. 7F. Pads 724 may be compliant pads as described herein. In the alternative, pads 724 may be stripped from the substrate 720 to provide freestanding contacts 800, 800' as shown in FIG. 8 (side view). A perspective view of a similar contact 400 is shown in FIG. 4.

Figure 9:
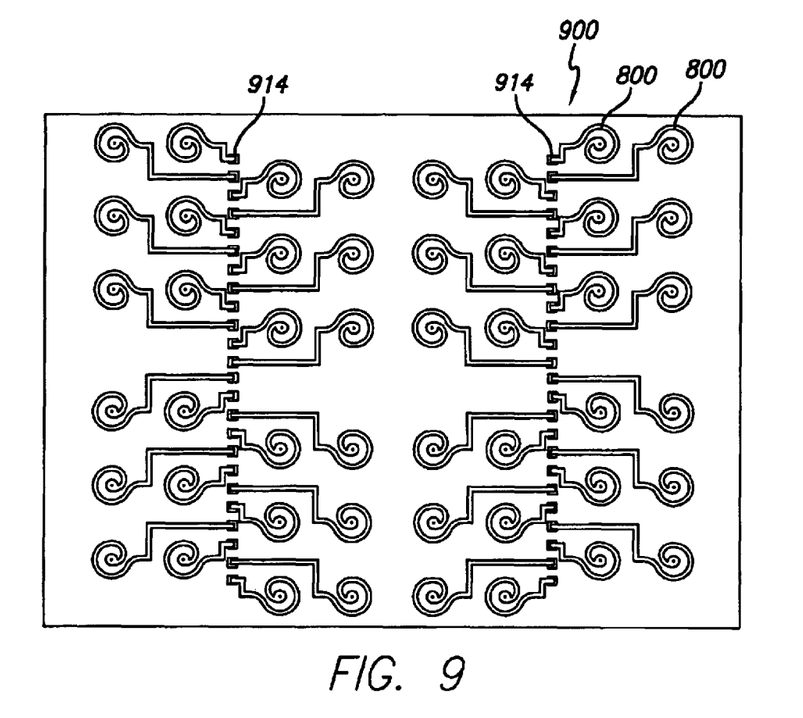
FIG. 9 is an enlarged plan view of an exemplary flip-chip semiconductor device having an array of microelectronic spring contacts according to the invention.

FIG. 9 shows an enlarged plan view of an exemplary flip-chip device 900 having an array of helical microelectronic spring contacts 800 on a surface thereof. Each contact 800 is connected to a terminal 914 of the device. Device 900 may be a semiconductor device, such as a memory chip or microprocessor. Spring contacts 800 may be formed directly on device 900, preferably prior to singulation from the semiconductor wafer. Contacts 800 may then be used to connect to the device for both testing and assembly purposes. Although flip-chip mounting represents the more compact design, it should be appreciated that contacts 800 may similarly be incorporated into CSP designs, if desired.

Figure 10:
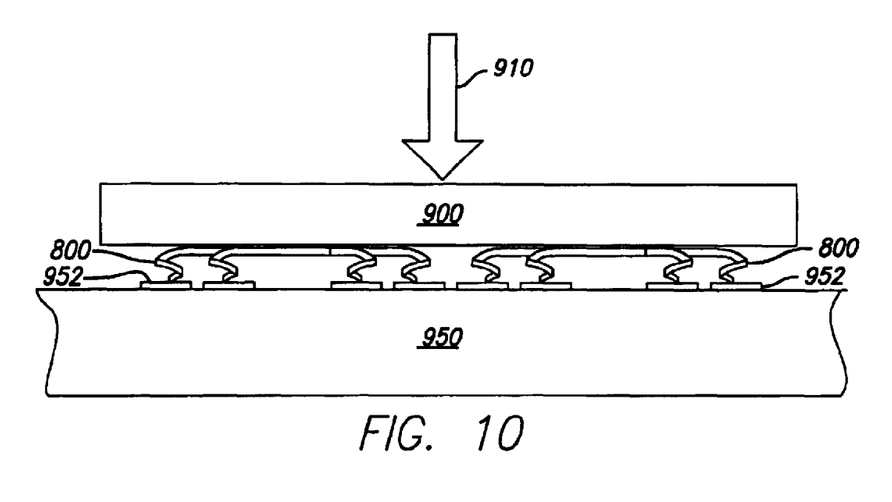
FIG. 10 is an enlarged side view of an exemplary flip-chip device with readily demountable and solderable microelectronic spring contacts according to the invention.

FIG. 10 shows a side view of device 900 in contact with a mating electrical component 950, such as a printed circuit board. A contact tip of each contact 800 is in contact with a terminal 952 of component 950. A controlled amount of compressive force 910 may be applied using a mounting frame or other fastening device, if it is desired to make the installation of device 900 readily demountable. The compressive force 910 causes deflection of contacts 800 in a direction perpendicular to substrate 950, and may cause lateral direction parallel to substrate 950. The lateral deflection of contacts 800 may provide a beneficial wiping action at the contact tips. Device 900 may be demounted as desired by releasing the compressive force 910. If contacts 800 are not soldered to terminals 952, lateral stress from thermal mismatch between substrate 950 and device 900 may be relieved by sliding between the contact tips of contacts 800 and terminals 952

Having thus described a preferred embodiment of helical microelectronic contact, it should be apparent to those skilled in the art that certain advantages of the within system have been achieved. It should also be appreciated that various modifications, adaptations, and alternative embodiments thereof may be made within the scope and spirit of the present invention. For example, particular shapes of compliant pads and spring contacts have been illustrated, but it should be apparent that the inventive concepts described above would be equally applicable to other shapes and configurations of pads and metallic elements having the general properties described herein.

As another example, the spring contacts described herein may be used with any electronic component, including not only semiconductor devices but (without limitation) probe cards and other testing devices. As yet another example, additional materials may be deposited on the spring contact structures described above; such materials enhancing the strength, resiliency, conductivity, etc. of the spring contact structures. As still another example, one or more layers of materials may be formed on the electronic component prior to or after creating the spring contact structures as described above. For example, one or more layers of redistribution traces (separated by insulative layers) may be formed on the electronic component followed by formation of the spring contacts on the redistribution layer. As another example, the spring contacts may first be formed followed by formation of one or more layers of redistribution traces.

What is claimed is:

1. A microelectronic contact for making electrical contact between a terminal of a device substrate and a mating component, the contact comprising:
   a compliant pad having a base adhered to the substrate, side surfaces extending away from the substrate and tapering to an end area distal from the substrate; and
   a trace extending from the terminal of the device and coiled over a portion of the side surfaces of the compliant pad to the end area, thereby defining a helix.

2. The microelectronic contact of claim 1, wherein the compliant pad is spaced apart from the terminal.

3. The microelectronic contact of claim 1, wherein the compliant pad is essentially non-conductive.

4. The microelectronic contact of claim 1, wherein the compliant pad is a shape selected from a pyramid, a truncated pyramid, a prism, a cone, a truncated cone, and a hemisphere.

5. The microelectronic contact of claim 1, wherein the trace comprises a nickel material.

6. The microelectronic contact of claim 1, wherein the compliant pad consists essentially of a material selected from silicone rubber, polyepoxide, polyimide, and polystyrene.

7. A microelectronic contact structure comprising:
   a freestanding resilient portion coiled in the shape of a tapered helix extending from a support substrate, the resilient portion formed by patterning a conductive material over a tapered sacrificial pad, and removing the pad;
   a conductive trace attached to the substrate surface and to an end of the resilient portion proximal to the substrate; and
   a contact tip at an end of the resilient portion distal from the substrate.

8. The microelectronic contact of claim 7, wherein the resilient portion is tapered in a shape selected from a pyramid, a truncated pyramid, a prism, a truncated prism, a cone, a truncated cone, and a hemisphere.

9. The microelectronic contact of claim 7, wherein the contact structure is coated with gold or alloy thereof.

10. A method for making a microelectronic contact comprising:
    providing a tapered pad comprising a base adhered to a device substrate, side surfaces extending away from the device substrate and tapering to a end area distal from the device substrate; and
    patterning a trace from a terminal of said substrate in a coiled pattern over the tapered pad to the end area, thereby defining a helix, wherein patterning a trace comprises:
        depositing a conformal layer of sacrificial material over the device substrate and tapered pad;
        patterning the conformal layer to form a trench extending from the terminal to the end area;
        plating a metallic material in the trench; and
        removing the conformal layer from the device substrate.

11. The method for making a microelectronic contact comprising:
    providing a tapered pad by etching a pit in a sacrificial substrate and filling the pit with a liquid elastomer material, the tapered pad comprising a base adhered to a device substrate, side surfaces extending away from the device substrate and tapering to a end area distal from the device substrate; and
    patterning a trace from a terminal of said substrate in a coiled pattern over the tapered pad to the end area, thereby defining a helix.

12. The method of claim 11, further comprising contacting the liquid elastomer material with the device substrate during curing of the liquid elastomer material.

13. A method for making a microelectronic contact comprising:
    providing a tapered pad comprised of an elastomer material, the tapered pad comprising a base adhered to a device substrate, side surfaces extending away from the device substrate and tapering to a end area distal from the device substrate; and
    patterning a trace from a terminal of said substrate in a coiled pattern over the tapered pad to the end area, thereby defining a helix.

14. A method for making a microelectronic contact comprising:
    providing a tampered pad comprising a base adhered to a device substrate, side surfaces extending away from the device substrate and tapering to a end area distal from the device substrate; and
    patterning a trace having a coiled portion and a straight portion, the coil portion patterned over the tampered pad from a terminal of said substrate forming a coiled pattern to the end area, and the straight portion patterned over the substrate from the terminal to an area separate from the tampered pad.

15. The microelectronic contact of claim 7, wherein the trace is tapered from the distal end.

16. The method of claim 14, wherein the providing step further comprises:

forming a tapered pad on a sacrificial substrate;

transferring the tapered pad to the device substrate.

17. The method of claim 16, wherein the transferring step further comprises transferring the tapered pad to the device substrate at a location spaced apart from a terminal of the device substrate.

18. The method of claim 14, wherein the patterning a trace step further comprises depositing a metallic material by a method selected from chemical vapor deposition, physical vapor deposition, and sputtering.

19. The method of claim 11, wherein the etching a pit step further comprises etching a pit having a shape selected from pyramidal, truncated pyramidal, stepped pyramidal, conical, hemispherical, prism-shaped, and truncated prism-shaped.

* * * * *